United States Patent
Yang

(10) Patent No.: US 8,367,981 B2
(45) Date of Patent: Feb. 5, 2013

(54) BAKING APPARATUS, BAKING METHOD AND METHOD OF REDUCING GAP WIDTH

(75) Inventor: Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 660 days.

(21) Appl. No.: 12/121,347

(22) Filed: May 15, 2008

(65) Prior Publication Data
US 2009/0286407 A1 Nov. 19, 2009

(51) Int. Cl.
*H05B 3/68* (2006.01)

(52) U.S. Cl. ............ 219/443.1; 430/330; 118/724; 118/725

(58) Field of Classification Search ............ 118/724, 118/725; 219/443.1; 430/330
See application file for complete search history.

(56) References Cited

U.S. PATENT DOCUMENTS

| 4,145,699 | A | * | 3/1979 | Hu et al. | ............ 257/35 |
| 2008/0008460 | A1 | | 1/2008 | Timans | |
| 2008/0280453 | A1 | * | 11/2008 | Koelmel et al. | ...... 438/758 |

FOREIGN PATENT DOCUMENTS

| TW | 200534063 | 10/2005 |
| TW | 200811919 | 3/2008 |

OTHER PUBLICATIONS

"Office Action of Taiwan Counterpart Application", issued on Sep. 19, 2012, p1-p7, in which the listed references were cited.

* cited by examiner

*Primary Examiner* — Daborah Chacko Davis
(74) *Attorney, Agent, or Firm* — J.C. Patents

(57) ABSTRACT

A baking apparatus including a hot plate and a substrate rotation member is provided. The hot plate has a heating surface. The substrate rotation member includes a rotation ring and a plurality of support arms. The rotation ring is configured to surround the hot plate. The support arms are disposed over the heating surface of the hot plate. Each of the support arms includes a connection part and a support part, wherein the connection part is configured to connect the rotation ring and the support part, and a supporting surface of the support part for supporting the substrate is higher than the heating surface of the hot plate.

13 Claims, 4 Drawing Sheets

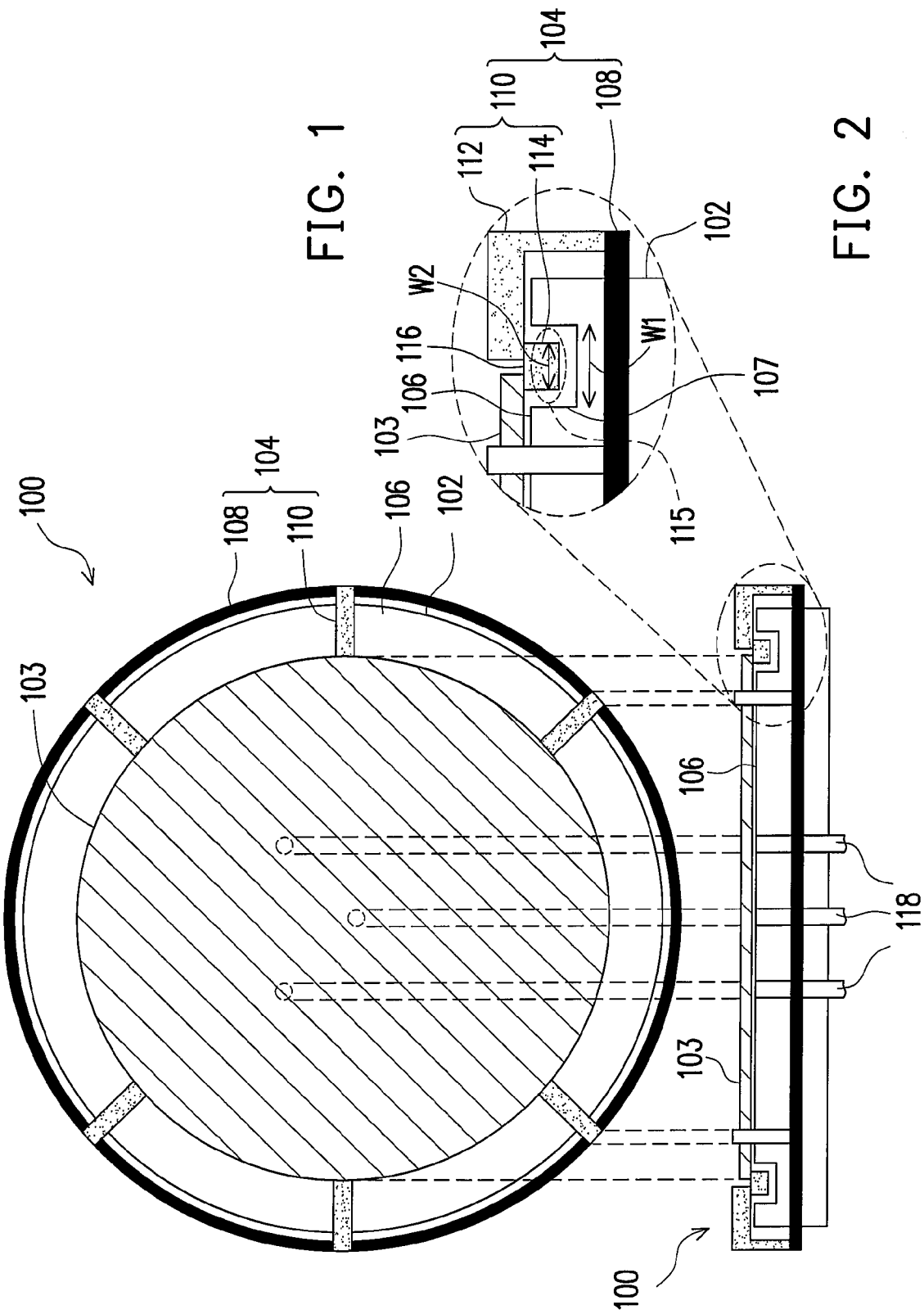

BAKING APPARATUS, BAKING METHOD AND METHOD OF REDUCING GAP WIDTH

BACKGROUND OF THE INVENTION

1. Field of Invention

The present invention relates to a semiconductor apparatus and a semiconductor fabrication method. More particularly, the present invention relates to a baking apparatus, a baking method and a method of reducing a gap width.

2. Description of Related Art

Due to the rapid development of integrated circuits, minimizing the device dimension and increasing the integration level have become the mainstream in semiconductor industry, and the key technology is in photolithography.

In the photolithography process, it is known that the uniformity of critical dimensions is affected by the baking temperature distribution. Usually a line width of 5 nm is changed as the temperature is shifted by each degree in Centigrade (° C.). A baking apparatus generally includes a plurality of heating units so as to control the temperature variation within +/−0.2° C. However, it is inevitable that when a substrate is heated in the baking apparatus, different sites of the substrate corresponding to the heating units are heated differently, and thus the baking temperature range is still up to 0.4° C.

As semiconductor production enters the nanometer era such as 65 nm or even less, the temperature range of 0.4° C. is high enough to cause variations in critical dimensions, and the yield and the performance of semiconductor devices are accordingly affected. Therefore, it has become an important topic about how to maintain the baking temperature to be more even so as to increase the uniformity of critical dimensions.

In addition, raising the line width resolution in the photolithographic process beyond 65 nm in the current state of technology is rather difficult, unless a light source having a shorter wavelength and a corresponding photoresist are used. However, it is very costly to replace existing machines entirely with new machines for this purpose. Therefore, another important topic about how to reduce critical dimensions controllably with existing machines has been developed.

SUMMARY OF THE INVENTION

The present invention provides a baking apparatus which can provide a uniform temperature distribution to a substrate, so that the decrease in the yield and the performance of a device resulted from an uneven baking temperature can be avoided.

The present invention further provides a baking method to maintain the baking temperature to be more even so as to increase the uniformity of critical dimensions.

The present invention also provides a method of reducing a gap width to reduce critical dimensions more evenly without replacing any existing manufacturing equipment in the fabrication.

The present invention provides a baking apparatus including a hot plate and a substrate rotation member. The hot plate has a heating surface. The substrate rotation member includes a rotation ring and a plurality of support arms. The rotation ring is configured to surround the hot plate. The support arms are disposed over the heating surface of the hot plate. Each of the support arms includes a connection part and a support part, wherein the connection part is configured to connect the rotation ring and the support part, and a supporting surface of the support part for supporting the substrate is higher than the heating surface of the hot plate.

According to an embodiment of the present invention, the hot plate further includes a ring-shaped trench in the heating surface, and a portion of the support part further extends to the ring-shaped trench.

According to an embodiment of the present invention, the supporting surface of the support part is about 0.1-0.2 mm higher than the heating surface of the hot plate.

According to an embodiment of the present invention, the baking apparatus further includes a plurality of support pins, wherein the support pins are disposed perpendicularly to the heating surface of the hot plate for supporting and moving up and down the substrate.

According to an embodiment of the present invention, the baking apparatus further includes a driving unit, wherein the driving unit is coupled to the rotation ring and is for rotating the rotation ring so as to rotate the substrate.

According to an embodiment of the present invention, the baking apparatus further includes at least one heating unit for heating the hot plate.

The present invention further provides a baking method. First, a substrate is provided, and the substrate has a photoresist layer thereon. Thereafter, a dynamic baking is performed to the photoresist layer, wherein the substrate is disposed over a hot plate, and the hot plate maintains static while the substrate keeps rotated.

According to an embodiment of the present invention, during the step of performing the dynamic baking, a spin rate of the substrate is between about 2 and 20 rpm.

According to an embodiment of the present invention, during the step of performing the dynamic baking, the substrate is rotated for about 2-10 cycles.

According to an embodiment of the present invention, the dynamic baking is a proximity baking in which the substrate is not in contact with the hot plate.

According to an embodiment of the present invention, the baking method further includes performing a static baking to the photoresist layer respectively after and before the step of performing the dynamic baking.

The present invention also provides a method of reducing a gap width. First, a substrate is provided, and the substrate has a patterned photoresist layer thereon, wherein the patterned photoresist layer has a plurality of patterns. Thereafter, a dynamic baking is preformed so that the patterned photoresist layer flows to the gaps between the patterns, wherein the substrate is disposed over a hot plate, and the hot plate maintains static while the substrate keeps rotating.

According to an embodiment of the present invention, during the step of performing the dynamic baking, a temperature of the dynamic baking is between about 140° C. and 160° C.

According to an embodiment of the present invention, during the step of performing the dynamic baking, a temperature of the dynamic baking is higher than a glass transition temperature of the patterned photoresist layer.

According to an embodiment of the present invention, during the step of performing the dynamic baking, a spin rate of the substrate is between about 2 and 20 rpm.

According to an embodiment of the present invention, during the step of performing the dynamic baking, the substrate is rotated for about 2-10 cycles.

According to an embodiment of the present invention, the dynamic baking is a proximity baking in which the substrate is not in contact with the hot plate.

In this invention, a dynamic baking can be conducted with the baking apparatus, in which a hot plate maintains static while the substrate keeps rotating. The baking apparatus is applicable to the baking method so that the baking temperature is more even and the uniformity of critical dimensions is enhanced. The baking apparatus is also be applicable to the method of reducing a gap width so that critical dimensions can be reduced uniformly to the desired dimensions without the requisite of replacing any existing manufacturing equipment in the fabrication.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 schematically illustrates a top view of a baking apparatus with a substrate thereon according to an embodiment of the present invention.

FIG. 2 is a side view of FIG. 1, and the right top side of FIG. 2 is a partially enlarged view.

DESCRIPTION OF EMBODIMENTS

Figure 3:
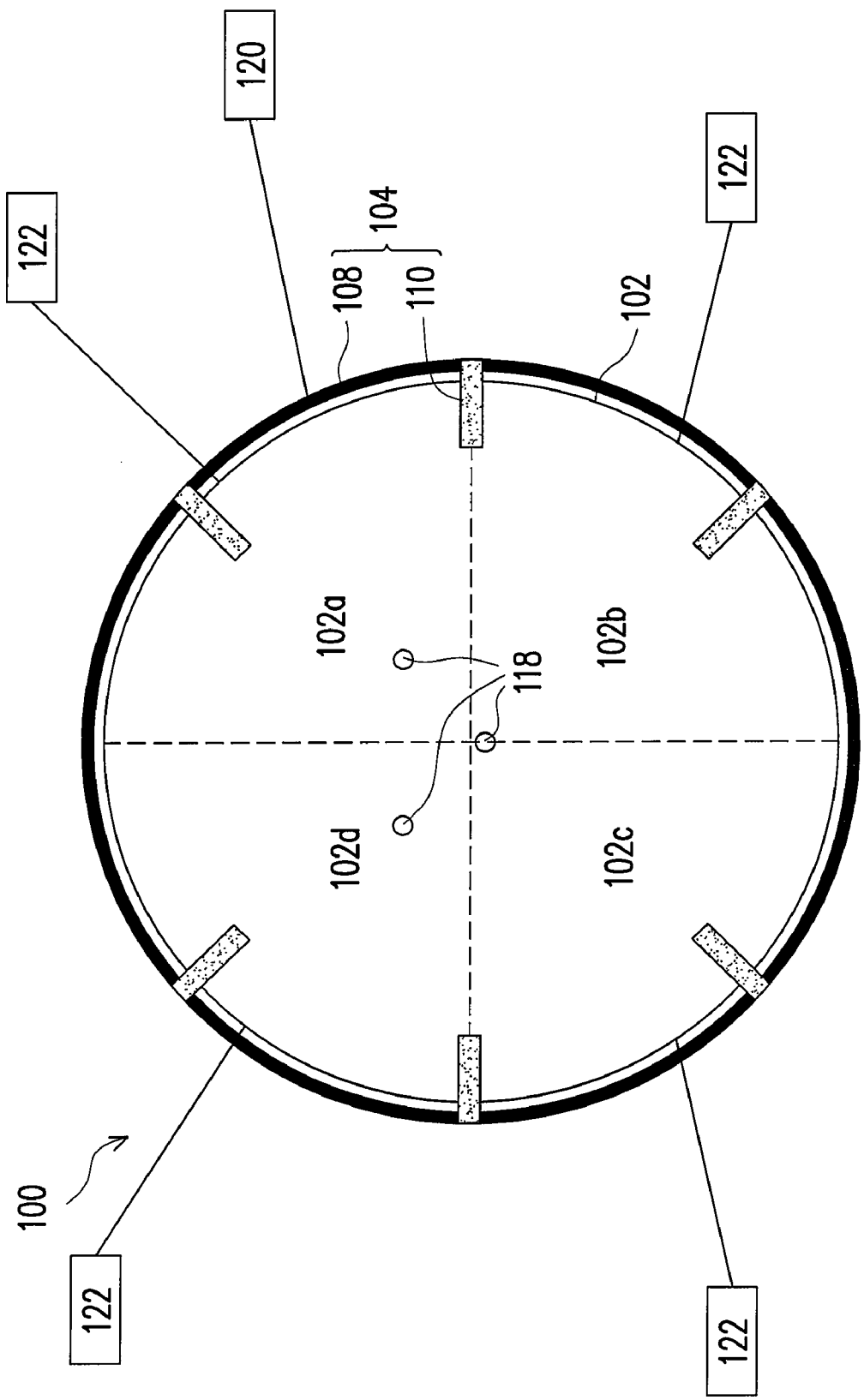
FIG. 3 schematically illustrates a top view of a baking apparatus according to an embodiment of the present invention.

FIG. 1 schematically illustrates a top view of a baking apparatus with a substrate thereon according to an embodiment of the present invention. FIG. 2 is a side view of FIG. 1, and the right top side of FIG. 2 is a partially enlarged view. FIG. 3 schematically illustrates a top view of a baking apparatus according to an embodiment of the present invention.

Referring to FIG. 1, a baking apparatus 100 includes a hot plate 102 and a substrate rotation member 104. The hot plate 102 is for heating a substrate 103. The rotation member 104 is for rotating the substrate 103 disposed over the hot plate 102.

The hot plate 102 has a heating surface 106. The substrate rotation member 104 includes a rotation ring 108 and a plurality of support arms 100. The rotation ring 108 is configured to surround the hot plate 102. The support arms 110 are disposed over the heating surface 106 of the hot plate 102 and respectively connect to the rotation ring 108. Each of the support arms 110 includes a connection part 112 and a support part 114. The support part 114 has a supporting surface 116 which is higher than the heating surface 106 of the hot plate 102. The supporting surface 116 supports the backside rim of the substrate 103 to keep a distance between the substrate 103 and the hot plate 102, so that a proximity baking can be performed.

In an embodiment, the hot plate 102 further includes a ring-shaped trench 107 in the heating surface 106, and a portion 115 (shown as the dotted region in FIG. 2) of the support part 114 further extends to the ring-shaped trench 107. Furthermore, as shown in FIG. 2, the width W1 of the ring-shaped trench 107 is designed to be greater than the width W2 of the portion 115 of the support part 114, so that enough space is present between the ring-shaped trench 107 and the portion 115 of the support part 114 to avoid any thermal stress or mechanical stress generated between them during the heating process.

In addition, the baking apparatus 100 can also include a plurality of support pins 118. The support pins 118 are disposed perpendicularly to the heating surface 106 of the hot plate 102 for supporting and moving up and down the substrate 103. The support pins 118 are configured to move the substrate 103 to an ascending position or a descending position (not shown). For example, the ascending position is for loading or unloading the substrate 103; the descending position is for heating the substrate 103, and the top of the support pins 118 is substantially as high as the heating surface 106 in the descending position.

Referring to FIG. 3, in an embodiment, the baking apparatus 100 can also include a driving unit 120 which is coupled to the rotation ring 108 and is for rotating the rotation ring 108 so as to rotate the substrate 103. In an embodiment, the baking apparatus 100 can further include at least one heating unit 122 for heating the hot plate 102. That is, the hot plate 102 is divided into a plurality of segments 102a, 102b, 102c and 102d, and each segment corresponds to a heating unit 122. In an embodiment, these heating units can control the temperature variation within +/−0.2° C.

It is noted that the baking method of the baking apparatus 100 in accordance with the present invention is a dynamic baking. During the heating process, the temperature variation among segments of the hot plate 102 can be averaged by rotating the substrate 103. It is known that the conventional baking apparatus is configured to operate a static baking only; therefore, when a temperature variation is present among segments of the hot plate, the temperature variation can not be eliminated and the temperature range can be up to 0.4° C. On the contrary, the baking apparatus 100 of the present invention can average the temperature variation by operating a dynamic baking; thus, the temperature variation among segments can be lowered to below 0.2° C. and the temperature uniformity can be enhanced about 50%.

Furthermore, during the heating process, the substrate 103 is disposed over the hot plate 102, and the substrate 103 is supported by the supporting surface 116 of the support part 114 of the substrate rotation member 104. The supporting surface 116 of the support part 114 is about 0.1-0.2 mm higher than the heating surface 106 of the hot plate 102; in other words, the substrate 103 and the hot plate 102 are very close but not in contact with each other. Accordingly, this type of baking is known as a proximity baking. The proximity baking not only can distribute the heat generated from the hot plate 102 to the substrate 103 evenly, but also can prevent the substrate 103 from contamination if there is any particle dropping to the hot plate 102 during the process.

It is appreciated by persons skilled in the art that the baking apparatus 100 according to the present invention can be combined with the conventional members such as chamber, gas supply source, gas exhaust system and so on. The baking apparatus 100 can be applied appropriately as long as the spirit and scope of this invention is not deviated.

Figure 4:
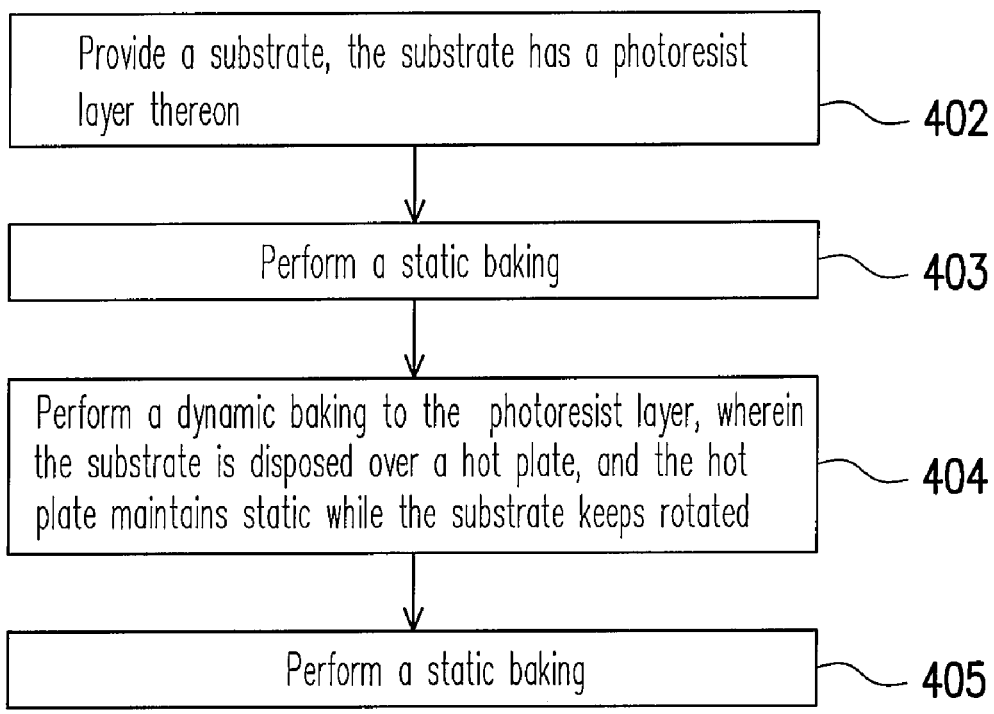
FIG. 4 schematically illustrates a flow chart of steps in a baking method according to an embodiment of the present invention.

Thereafter, a baking method in the lithography process will be introduced. FIG. 4 schematically illustrates a flow chart of steps in a baking method according to an embodiment of the present invention.

Referring to FIG. 4, a step 402 is performed. In the step 402, a substrate such as a wafer is provided, and the wafer has a photoresist layer thereon. Thereafter, a step 404 is performed. In the step 404, a dynamic baking is performed to the photoresist layer, wherein the substrate is disposed over a hot plate, and the hot plate maintains static while the substrate keeps rotating. The dynamic baking is a proximity baking in which the substrate is not in contact with the hot plate. In an embodiment, the baking method in accordance with the present invention may be processed in the baking apparatus 100 (as shown in FIG. 1), for example.

In addition, referring to steps 403 and 405 in FIG. 4, a static baking can be performed to the photoresist layer respectively before and after the step of performing the dynamic baking. For example, a baking recipe including at least three steps is performed as follows. First, a first static baking is performed under the condition that the substrate is not being rotated with the baking time of about 0.5-1.0 second. Thereafter, a dynamic baking is performed under the condition that the substrate is rotated, in which the baking time is about 60-120 seconds and the spin speed of the substrate is between about 2 and 20 rpm; or the substrate is rotated by about 2-10 cycles during the baking time in the dynamic baking. Afterwards, a second static baking is performed under the condition that the substrate is not being rotated with the baking time of about 0.5-1.0 second.

In accordance to the baking method of the present invention, the baking temperature can be more even so as to increase the uniformity of critical dimensions and variations in critical dimensions caused by the uneven baking temperature can be obviated. That is, the baking method can increase the temperature uniformity about 50% and thus, the uniformity of critical dimensions is also enhanced about 50%.

Figure 5:
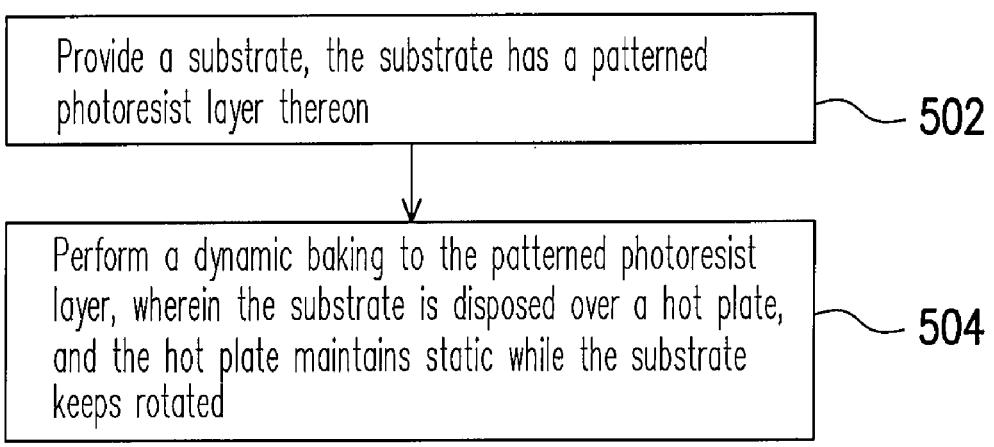
FIG. 5 schematically illustrates a flow chart of steps in a method of reducing a gap width according to an embodiment of the present invention.
Figure 6A:
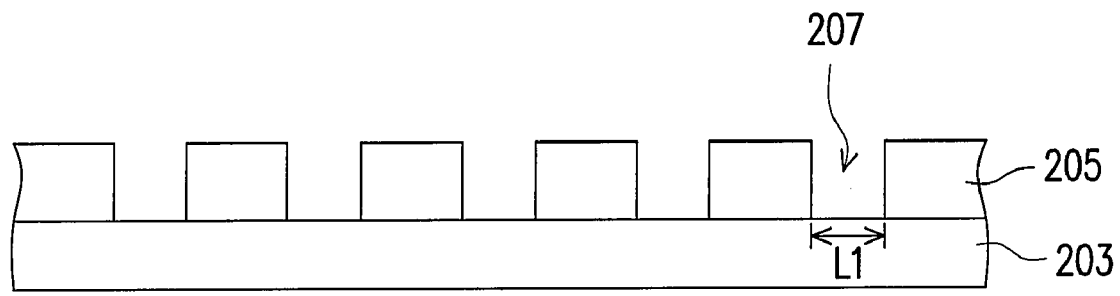
FIGS. 6A and 6B schematically illustrate a deformation of a patterned photoresist layer according to an embodiment of the present invention.
Figure 6B:
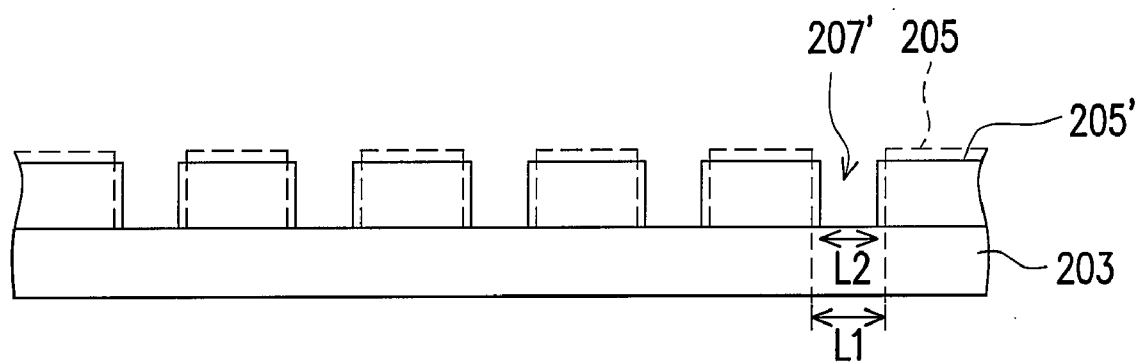

Next, a method of reducing a gap width will be introduced. FIG. 5 schematically illustrates a flow chart of steps in a method of reducing a gap width according to an embodiment of the present invention. FIGS. 6A and 6B schematically illustrate a deformation of a patterned photoresist layer according to an embodiment of the present invention.

Referring to FIGS. 5 and 6A, a step 502 is performed first. In the step 502, a substrate 203 such as a wafer is provided, and the wafer has a patterned photoresist layer 205 thereon. The patterned photoresist layer 205 has a plurality of patterns and the width of gaps 207 between the patterns is denoted as L1.

Referring to FIG. 5, a step 504 is then performed. In the step 504, a dynamic baking is performed to the patterned photoresist layer 205, wherein the substrate 203 is disposed over a hot plate, and the hot plate maintains static while the substrate 203 keeps rotating. The dynamic baking is a proximity baking in which the substrate is not in contact with the hot plate. In an embodiment, the method of reducing a gap width in accordance with the present invention may be processed in the baking apparatus 100 (as shown in FIG. 1), for example.

According to the method of reducing a gap of the present invention, the dynamic baking can be implemented in a hard baking (HB) process, and the hard baking process can be arranged after development or before etching. The dynamic baking temperature is higher than the glass transition temperature (Tg) of the patterned photoresist layer 205, such as between about 140° C. and 160° C. When the temperature is higher than Tg of the patterned photoresist layer 205, the patterned photoresist layer 205 flows to the gaps 207 between the patterns. As shown in FIG. 6B, the patterned photoresist layer 205 is deformed to the patterned photoresist layer 205' due to the thermal reflow process, and the width of the gaps 207 is reduced to L2.

Further, during the step of performing the dynamic baking, the spin rate of the substrate 203 is between about 2 and 20 rpm, or the substrate 203 is rotated by about 2-10 cycles during the baking time in the dynamic baking, for example. Therefore, the gap width is reduced more uniformly as the substrate 203 is heated more evenly.

The method of reducing a gap width provided by the present invention can reduce critical dimensions of semiconductor devices in a uniform way by the thermal reflow process of the dynamic baking, without the requisite of replacing any existing manufacturing equipment in the fabrication. Thus, the cost is greatly reduced and the competitiveness is significantly improved.

In summary, a dynamic baking in which a hot plate maintains static while the substrate keeps rotating can be performed with the baking apparatus of the present invention. The baking apparatus is applicable to the baking method so that the baking temperature is more even and the uniformity of critical dimensions is enhanced. The baking apparatus is also applicable to the method of reducing a gap width so that critical dimensions can be reduced uniformly to the desired dimensions without replacing any existing manufacturing equipment in the fabrication.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A baking apparatus, comprising:
   a hot plate, comprising a heating surface and configured to heat a substrate disposed over the heating surface, the heating surface of the hot plate is larger than a surface of the substrate; and
   a substrate rotation member, comprising:
   a rotation ring, configured to surround the hot plate; and
   a plurality of support arms, disposed right over the heating surface of the hot plate and each having a connection part and a support part, wherein the connection part connects the rotation ring and the support part, and a supporting surface of the support part for supporting the substrate is higher than the heating surface of the hot plate.

2. The apparatus of claim 1, wherein the hot plate further comprises a ring-shaped trench in the heating surface, and a portion of the support part further extends to the ring-shaped trench.

3. The apparatus of claim 2, wherein the ring-shaped trench is in the heating surface, and is disposed along an edge of the heating surface, and the portion of the support part and a portion of the connection part extend to the ring-shaped trench.

4. The apparatus of claim 1, wherein the supporting surface of the support part is about 0.1-0.2 mm higher than the heating surface of the hot plate.

5. The apparatus of claim 1, further comprising a plurality of pins, wherein the pins are disposed perpendicularly to the heating surface of the hot plate for moving up and down the substrate.

6. The apparatus of claim 1, further comprising a driving unit, wherein the driving unit is coupled to the rotation ring and is for rotating the rotation ring so as to rotate the substrate.

7. The apparatus of claim 1, further comprising at least one heating unit for heating the hot plate.

8. The apparatus of claim 1, wherein the support part and the connection part are disposed right over a peripheral of the heating surface of the hot plate, and the connection part further extends to an edge wall of the hot plate to connect the support part and the rotation ring.

9. A baking method, comprising:
   providing a substrate, the substrate has a photoresist layer thereon; and
   performing a dynamic baking to the photoresist layer, wherein the substrate is disposed over a hot plate, and the hot plate maintains static stationary that is not moved or sheared or rotated while the substrate keeps rotating by a driving unit, the driving unit is coupled to a rotation ring, and rotates the rotation ring so as to rotate the substrate; and
   performing a static baking to the photoresist layer respectively before and after the step of performing the dynamic baking, wherein the static baking is performed while the substrate with the photoresist layer formed thereon is not rotated.

10. The method of claim 9, wherein during the step of performing the dynamic baking, a spin rate of the substrate is between about 2 and 20 rpm.

11. The method of claim 9, wherein during the step of performing the dynamic baking, the substrate is rotated for about 2-10 cycles.

12. The method of claim 9, wherein the dynamic baking is a proximity baking in which the substrate is not in contact with the hot plate.

13. The method of claim 9, wherein the substrate is disposed over the hot plate with a distance of 0.1-0.2 nm during performing the dynamic baking.

* * * * *